US006623911B1

United States Patent
Jong et al.

(10) Patent No.: US 6,623,911 B1
(45) Date of Patent: Sep. 23, 2003

(54) METHOD TO FORM CODE MARKS ON MASK ROM PRODUCTS

(75) Inventors: Yu-Chang Jong, Taipei (TW); Tai-Yuan Wu, Taipei (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 55 days.

(21) Appl. No.: 09/953,524

(22) Filed: Sep. 17, 2001

(51) Int. Cl.⁷ .................................................. G03F 7/20
(52) U.S. Cl. ........................ 430/313; 430/394; 430/396
(58) Field of Search ................................ 430/311, 313, 430/322, 394, 396

(56) References Cited

U.S. PATENT DOCUMENTS

| | | | |
|---|---|---|---|
| 5,051,374 A | 9/1991 | Kagawa et al. ................. | 437/8 |
| 5,316,966 A | 5/1994 | Van Der Plas et al. ........ | 437/70 |
| 5,393,233 A | 2/1995 | Hong et al. .................... | 437/48 |
| 5,576,236 A | 11/1996 | Chang et al. .................. | 437/48 |
| 5,668,030 A * | 9/1997 | Chung ........................... | 438/401 |
| 5,705,404 A | 1/1998 | Huber et al. ................... | 437/8 |
| 6,187,638 B1 | 2/2001 | Wen ............................. | 438/278 |
| 6,312,876 B1 * | 11/2001 | Huang ........................... | 430/323 |

\* cited by examiner

*Primary Examiner*—Kathleen Duda
(74) *Attorney, Agent, or Firm*—George O. Saile; Stephen B. Ackerman; Rosemary L. S. Pike

(57) ABSTRACT

A method for forming a clear code mark that is independent of backend planarization by adding an extra exposing step to the normal photolithography process is described. A layer to be patterned is provided on a substrate. A photoresist layer is coated overlying the layer to be patterned. The photoresist layer is first exposed through a code mask and second exposed through a patterning mask. The photoresist layer is developed to form a photoresist mask having a code mark pattern from the code mask and a device pattern from the patterning mask. The layer to be patterned is etched away where it is not covered by the photoresist mask to form simultaneously device structures and a code mark in the fabrication of an integrated circuit device.

13 Claims, 4 Drawing Sheets

METHOD TO FORM CODE MARKS ON MASK ROM PRODUCTS

BACKGROUND OF THE INVENTION (1) Field of the Invention

The present invention relates to the fabrication of integrated circuit devices, and more particularly, to a method of forming code marks in the fabrication of integrated circuits.

(2) Description of the Prior Art

Read-only memory (ROM) devices are widely used in the art. ROM integrated circuit devices are fabricated using basically the same process steps until the memory cell content programming. From this point, a code mask is used to provide the particular mask pattern corresponding to the code contents of the ROM device. It is important to put an identification code mark on the periphery of each wafer because the ROM devices all look the same to the human eye. Customers request code identification frequently during wafer sorting, die sawing, and chip packaging.

Typically, code marks are formed by implanting an impurity into a field oxide region during code implantation. A short wet-dip process is performed. Because of the faster etch rate of the impurity implanted area, a shallow trench is formed having the code mark pattern. However, this trench is well planarized by subsequent interlevel dielectric (ILD) and intermetal dielectric (IMD) layers, especially for 0.5 $\mu$m and below technology. Based on the inventors' experience, this kind of code mark completely disappears after passivation on 0.4 $\mu$m double metal mask ROM wafers.

One solution to the problem of disappearing code marks is adding an extra photoresist layer and short etching process to form a shallow code mark trench on the IMD or passivation layers. The cost of this method is an entire photoresist layer, etching, and photoresist stripping process.

Another possible solution is growing an extra nitride-based layer before the code photolithography process. The nitride-based layer is then etched after the code photolithography process to form the code mark. The cost of this method is an extra furnace or chemical vapor deposition process step and an etching step.

It is desired to find a solution to the disappearing code mark problem that will work for 0.5 $\mu$m and below technology with little added overhead.

U.S. Pat. No. 6,187,638 to Wen shows a ROM code ion implant process. U.S. Pat. No. 5,393,233 to Hong et al discloses the formation of a nitride code mark where the nitride also forms dummy lines in the process of fabricating closely spaced polysilicon lines. U.S. Pat. No. 5,051,374 to Kagawa et al forms a polysilicon layer over code marks and removes passivation layers over the code marks. U.S. Pat. No. 5,576,236 to Chang et al and U.S. Pat. No. 5,668,030 to Chung et al form a code mark in a buffer layer. U.S. Pat. No. 5,705,404 to Huber et al discloses an implanted window to identify a code during failure analysis. U.S. Pat. No. 5,316,966 to Van Der Plas et al teaches an alignment mark process.

SUMMARY OF THE INVENTION

Accordingly, the primary object of the invention is to provide a process for forming a code mark on a ROM wafer in the fabrication of integrated circuits.

A further object of the invention is to provide a process for forming a code mark for 0.5 $\mu$m and below technology.

Another object of the invention is to provide a process for forming a clear code mark that is independent of backend planarization.

Yet another object of the invention is to provide a process for forming a clear code mark that is independent of backend planarization by adding an extra exposing step to the normal photolithography process.

In accordance with the objects of the invention, a method for forming a clear code mark that is independent of backend planarization by adding an extra exposing step to the normal photolithography process is achieved. A layer to be patterned is provided on a substrate. A photoresist layer is coated overlying the layer to be patterned. The photoresist layer is first exposed through a code mask and second exposed through a patterning mask. The photoresist layer is developed to form a photoresist mask having a code mark pattern from the code mask and a device pattern from the patterning mask. The layer to be patterned is etched away where it is not covered by the photoresist mask to form simultaneously device structures and a code mark in the fabrication of an integrated circuit device.

BRIEF DESCRIPTION OF THE DRAWINGS

In the accompanying drawings forming a material part of this description, there is shown.

DESCRIPTION OF THE PREFERRED EMBODIMENTS

The process of the present invention inserts an extra exposing step into the normal photolithography process so that the code identification mark can be developed with other layers such as metal or via layers. The successive metal or via etching then forms the normal metal or via pattern as well as the code mark pattern.

Figure 1:
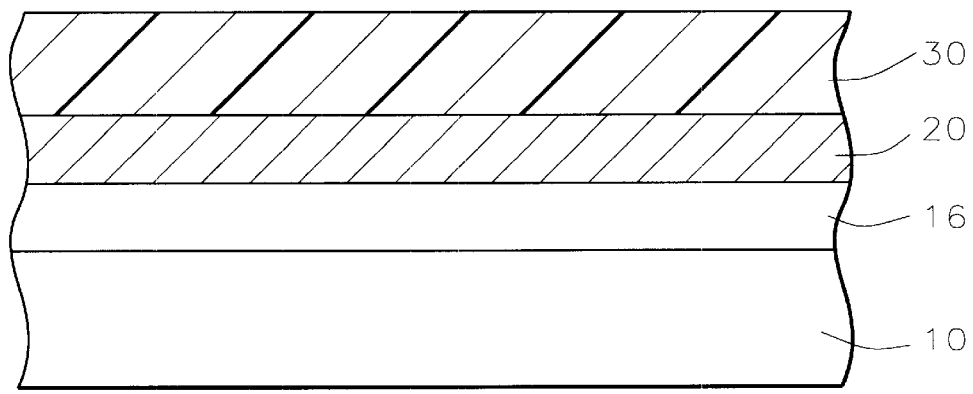
FIGS. 1 through 7 are cross-sectional representations of a preferred embodiment of the present invention.

Referring now more particularly to FIG. 1, there is shown a semiconductor substrate 10, preferably composed of monocrystalline silicon. Semiconductor device structures, not shown, may be formed in and on the semiconductor substrate. Coding and code identification marks may be made to the substrate as is conventional. The problem occurs when passivation layers are formed over the code identification marks. Such a passivation layer is the ILD or IMD layer 16. This layer may be formed over gate electrodes, capacitors, metal interconnection lines, and so on. Especially in the 0.5 $\mu$m and below technology, the ILD or IMD layer 16 will fill the code identification mark formed at lower levels, making the code mark invisible to human inspectors.

The process of the present invention provides a method to apply the code mark to succeeding metal or dielectric layers so that it will be visible to inspection. The method of the invention may be used to apply the code mark to each layer or only to particular layers, such as the topmost layer, as required.

A metal layer 20 is deposited over the IMD layer 16. The metal is to be patterned to form metal lines in the fabrication of the ROM device. Alternatively, the layer may be a dielectric layer into which vias are to be etched.

Figure 5:
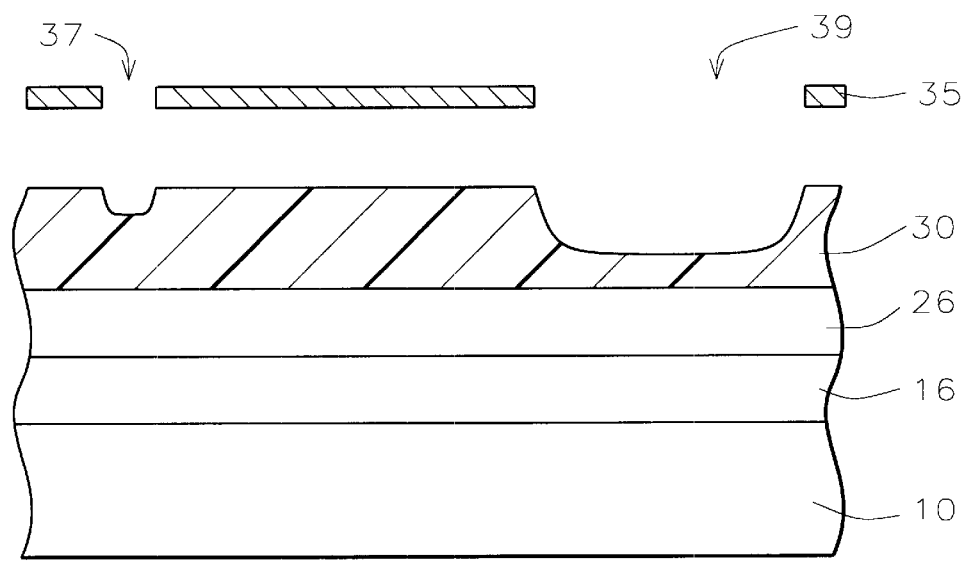

A photoresist layer 30 is coated over the metal layer 20, as shown in FIG. 1. FIG. 5 shows the photoresist layer 30 coated over a dielectric layer 26. Conventionally, the photoresist layer is to be exposed through a patterning mask to form a photoresist mask for patterning the layer. The process of the present invention inserts an additional exposure step prior to (or subsequent to) the normal exposure step.

Figure 2:
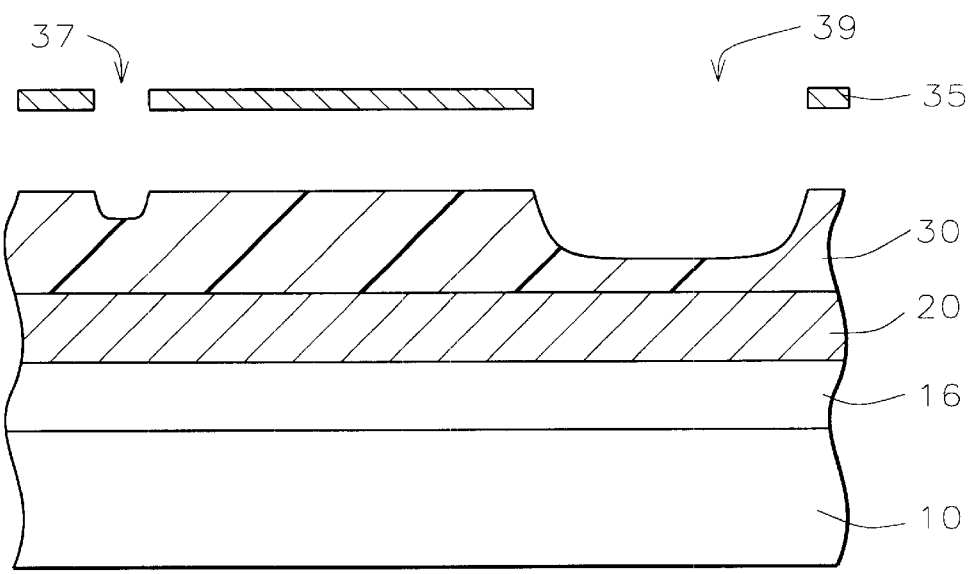

The code mask 35 is applied over the photoresist layer, as shown in FIG. 2 and in FIG. 5. The ROM code pattern is shown at 37 and the code number pattern 39 is shown. The code number pattern is defined on the code mask. For those metal lines or vias that go through ROM blocks, code windows in the ROM blocks will cause serious broken metal lines or extra via holes. To avoid this problem, the process of the present invention exposes the photoresist through the code mask under defocus and low energy conditions so that the code window in the ROM block is strongly under-developed while the code mark, which has a much larger dimension than the code window, is still well developed. This is so that the metal lines or vias in the ROM block are not affected by this first exposing step. The energy level of this exposure step may be less than half og the energy level of the patterning mask exposure step. A defocus condition is achieved by setting the focus parameter to an extremely high or an extremely low value.

Figure 3:
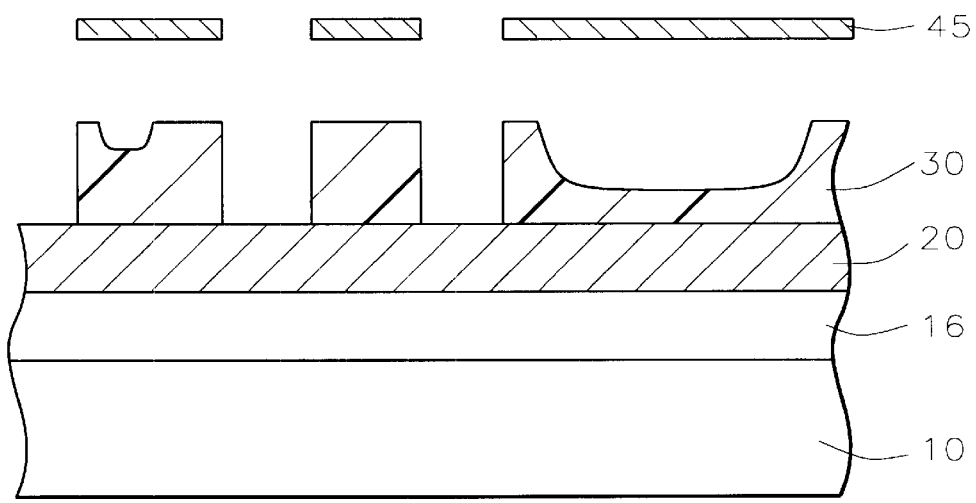
Figure 6:
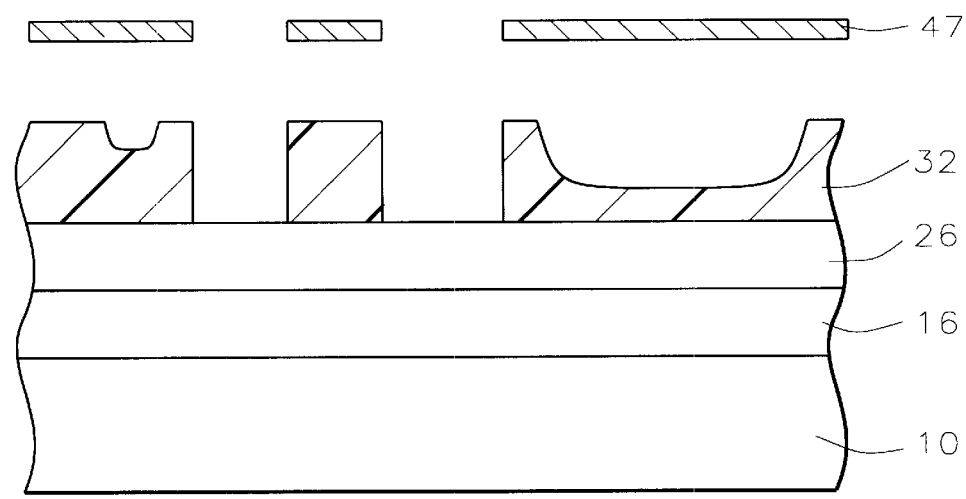

Referring now to FIG. 3, the patterning mask 45 for the metal layer 20 is applied. Similarly, FIG. 6 shows the patterning mask 47 for the via layer 26. This time, the photoresist 30 is exposed to the standard photolithography exposure and developing to form the photoresist pattern 30 for the layer 20 (shown in FIG. 3) or the photoresist pattern 32 for the layer 26 (shown in FIG. 6). The photoresist mask 30 contains both the metal pattern and the code mark pattern. The photoresist mask 32 contains both the via pattern and the code mark pattern.

Figure 4:
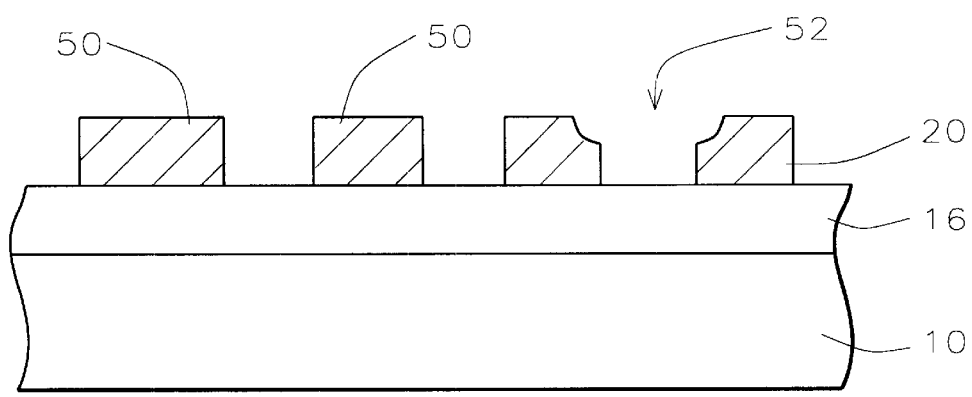
Figure 7:
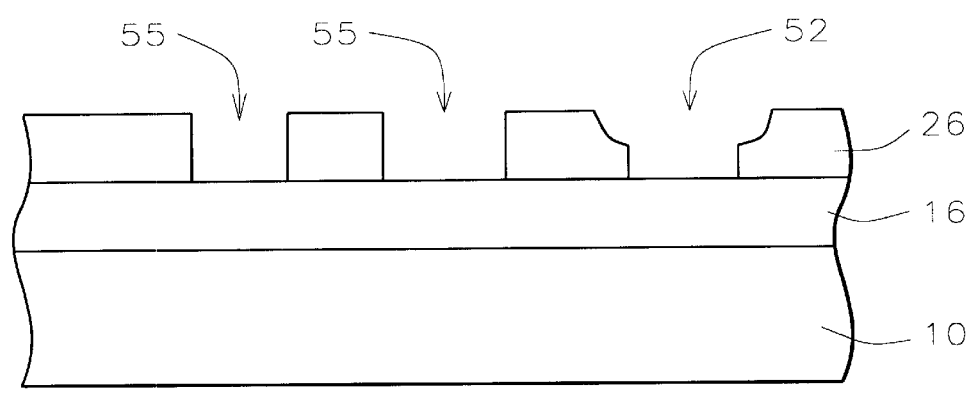

Now, as shown in FIG. 4, normal etching is performed on the layer 20 to form normal metal lines 50 and the code mark 52 at the same time. Or, as shown in FIG. 7, normal etching is performed on layer 26 to form the vias 55 and the code mark 52 at the same time.

The process of the present invention has been implemented and it has been found that the code mark is formed very clearly while the metal lines or vias across the ROM block are not affected at all. The process of the present invention provides a method for forming a clear code mark, independent of backend planarization. An extra exposing step is added at low energy and defocussed conditions to transfer the code mark pattern to a metal or dielectric layer. The normal metal or dielectric layer pattern is then transferred to the layer and etching provides both the normal pattern and the code mark. The only cost is in throughput of the original metal or via photolithography step. No extra photoresist, dip, etching, or photoresist stripping step is required.

The process of the present invention provides a novel and effective method to form a code mark on mask ROM products by the addition of an extra photoresist exposure step at low energy and defocussed conditions.

While the invention has been particularly shown and described with reference to the preferred embodiments thereof, it will be understood by those skilled in the art that various changes in form and details may be made without departing from the spirit and scope of the invention.

What is claimed is:

1. A method of forming a code mark in the fabrication of an integrated circuit device comprising:

providing a layer to be patterned on a substrate;

coating a photoresist layer overlying said layer to be patterned;

exposing said photoresist layer through a code mask wherein said exposing comprises a first low energy and defocused conditions;

exposing said photoresist layer through a patterning mask wherein said exposing comprises a second energy higher than said first energy wherein said first energy is less than half of said second energy;

developing said photoresist layer to form a photoresist mask having a code mark pattern from said code mask and a device pattern from said patterning mask; and etching away said layer to be patterned where it is not covered by said photoresist mask to form simultaneously device structures and said code mark in the fabrication of said integrated circuit device.

2. The method according to claim 1 wherein said layer to be patterned is a metal layer and wherein said device structures are metal lines.

3. The method according to claim 1 wherein said layer to be patterned is a dielectric layer and wherein said device structures are vias.

4. The method according to claim 1 wherein said code mask comprises a code window pattern and a code mark pattern and wherein said low energy and said defocused condition causes said code window pattern to be strongly under-developed while said code mark pattern is well-developed whereby said code window pattern is not transferred to said device structures.

5. A method of forming a code mark in the fabrication of an integrated circuit device comprising:

providing a layer to be patterned on a substrate;

coating a photoresist layer overlying said layer to be patterned;

exposing said photoresist layer through a code mask wherein said exposing comprises a first energy and defocused conditions;

exposing said photoresist layer through a patterning mask wherein said exposing comprises a second energy higher than said first energy;

developing said photoresist layer to form a photoresist mask having a code mark pattern from said code mask and a device pattern from said patterning mask; and etching away said layer to be patterned where it is not covered by said photoresist mask to form simultaneously device structures and said code mark in the fabrication of said integrated circuit device.

6. The method according to claim 5 wherein said layer to be patterned is a metal layer and wherein said device structures are metal lines.

7. The method according to claim 5 wherein said layer to be patterned is a dielectric layer and wherein said device structures are vias.

8. The method according to claim 5 wherein said first energy is between less than half of said second energy.

9. The method according to claim 5 wherein said code mask comprises a code window pattern and a code mark pattern and wherein said first energy smaller than said second energy and said defocused condition cuases said code window pattern to be strongly under-developed while said code mark pattern is well-developed whereby said code window pattern is not transferred to said device structures.

10. A method of forming a code mark in the fabrication of an integrated circuit device comprising:

providing a layer to be patterned on a substrate;

coating a photoresist layer overlying said layer to be patterned;

exposing said photoresist layer through a code mask wherein said code mask comprises a code window pattern and a code mark pattern wherein said exposing comprises a first energy and defocused conditions whereby said code window pattern is strongly underdeveloped while said code mark pattern is well-developed;

exposing said photoresist layer through a patterning mask wherein said exposing comprises a second energy higher than said first energy;

developing said photoresist layer to form a photoresist mask having a code mark pattern from said code mask and a device pattern from said patterning mask; and etching away said layer to be patterned where it is not covered by said photoresist mask to form simultaneously device structures and said code mark wherein said code window pattern is not transferred to said device structures in the fabrication of said integrated circuit device.

11. The method according to claim 10 wherein said layer to be patterned is a metal layer and wherein said device structures are metal lines.

12. The method according to claim 10 wherein said layer to be patterned is a dielectric layer and wherein said device structures are vias.

13. The method according to claim 10 wherein said first energy is less than half of said second energy.

* * * * *